United States Patent [19]
Van Tol

[11] Patent Number: 5,576,771
[45] Date of Patent: Nov. 19, 1996

[54] HORIZONTAL PICTURE COMPRESSION IN WIDESCREEN TELEVISION RECEIVERS

[75] Inventor: Willem C. Van Tol, Knoxville, Tenn.

[73] Assignee: Philips Electronics North America Corporation, New York, N.Y.

[21] Appl. No.: 259,251

[22] Filed: Jun. 13, 1994

[51] Int. Cl.$^6$ ................................................. H04N 5/46
[52] U.S. Cl. ........................... 348/556; 348/445; 348/913
[58] Field of Search ..................... 348/445, 556, 348/913; H04N 7/01

[56] References Cited

U.S. PATENT DOCUMENTS 5,159,438  10/1992  Rabii ........................................ 348/445
5,313,303  5/1994  Ersoz et al. ............................. 348/913

Primary Examiner—Victor R. Kostak
Assistant Examiner—Brian Johnson
Attorney, Agent, or Firm—Edward W. Goodman

[57] ABSTRACT

A circuit in a widescreen television receiver effects horizontal picture compression on a standard aspect ratio video signal by storing at least one field of the video signal, generating a read clock signal for reading the video signal from storage, wherein the read clock signal has a frequency equal to $F_R$, generating a write clock signal for writing the video signal into storage, wherein the write clock signal has a frequency equal to $F_W = \frac{3}{4} F_R$. The circuit arrangement includes a write circuit for writing each line in the video signal into a memory using the write clock signal, and a read circuit for reading each line of the stored video signal from the memory using the read clock signal, whereby the readout video signal forms, on display, a picture occupying ¾ of the horizontal width of a display of the widescreen television receiver. The circuit is distinguished in that the circuitry for generating the write clock signal divides the read clock signal by a factor of 4, and, since the divided read clock signal, while having no second harmonic, has a strong third harmonic, band-pass filters this divided read clock at the third harmonic which is equal to the write clock signal frequency.

2 Claims, 4 Drawing Sheets

HORIZONTAL PICTURE COMPRESSION IN WIDESCREEN TELEVISION RECEIVERS

BACKGROUND OF THE INVENTION

1. Field of the Invention

The subject invention relates to the display of 4:3 aspect ratio interlaced television signals on a widescreen 16:9 television receiver.

2. Description of the Related Art

Substantially changing the deflection width of a picture tube is difficult. Relatively high power has to be handled and anode voltage is affected. The horizontal deflection of the 16:9 widescreen television receiver is therefore kept at a constant full screen width. If, however, the presented program is in the 4:3 format, then a video compression of ¾ is needed over one line scan with the remaining ¼ line length blanked or used for different information (for example, Picture-Outside-Picture (POP)). Alternatively, this ¼ blanked line length could be divided into two equal ⅛ line lengths left and right of the main picture, as shown in FIG. 1.

As shown in FIG. 2, field memories are ordinarily used to convert the standard interlaced NTSC signal into a progressive scanned frame. To compress, one may choose to write into the field memory at a relatively slow rate, while still obeying Nyquist criteria, and read out at a higher rate. For pixel stability, both sample frequencies should be phase locked to each other and to the horizontal deflection.

Currently, the read out is done at a sampling rate of $910 \times f_H = 14.318$ MHz. The progressive scan memory logic however needs two clock phases per read or write cycle and, as such, the clock rate must be doubled towards 28.636 MHz. The write frequency should then be chosen to be $¾ \times 2 \times 910 \times f_H = 21.477$ Mhz. to obtain the desired compression. For a purely digital solution, the voltage controlled oscillator in the phase locked loop circuitry must then be brought up to three times the read frequency and divided by four to obtain the write frequency. The tripled frequency 85.9 MHz. is, however, beyond the range of present technology used in television receivers.

SUMMARY OF THE INVENTION

It is an object of the present invention to provide the needed clock frequencies without exceeding the technical capabilities of the circuitry.

This object achieved in a circuit in a widescreen television receiver for effecting horizontal picture compression on a standard aspect ratio video signal comprising: means for storing at least one field of said video signal, means for generating a read clock signal for reading said video signal from said storing means, said read clock signal having a frequency equal to $F_R$, means for generating a write clock signal for writing said video signal into said storing means, said write clock signal having a frequency equal to $F_W = ¾ F_R$, write means for writing each line in said video signal into said storing means using said write clock signal, and read means for reading each line of said stored video signal from said storing means using said read clock signal, whereby said read-out video signal forms, on display, a picture occupying ¾ of the horizontal width of a display of said widescreen television receiver, characterized in that said means for generating a write clock signal comprises means for dividing said read clock signal by a factor of 4, and means coupled to the output of said dividing means for multiplying said divided read clock signal by a factor of 3.

Applicant has found that the divided read clock signal, while having no second harmonic, has a strong third harmonic. Therefore, a further characteristic of the subject invention is that the means for multiplying the divided read clock signal comprises a band-pass filter tuned to the write clock signal frequency.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
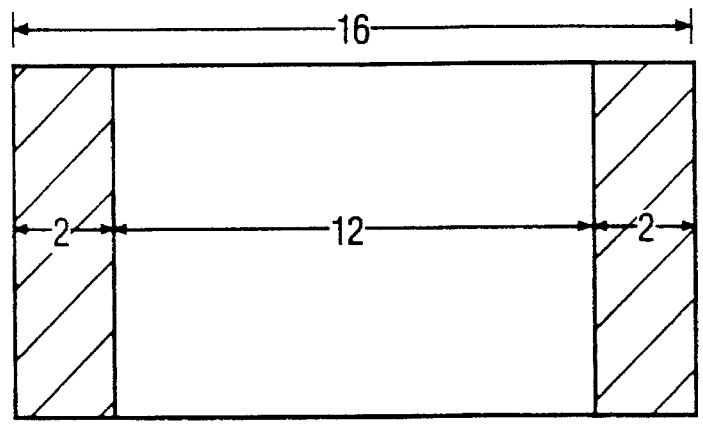
FIG. 1 shows a widescreen display having a standard aspect ratio picture formed thereon.
Figure 2:
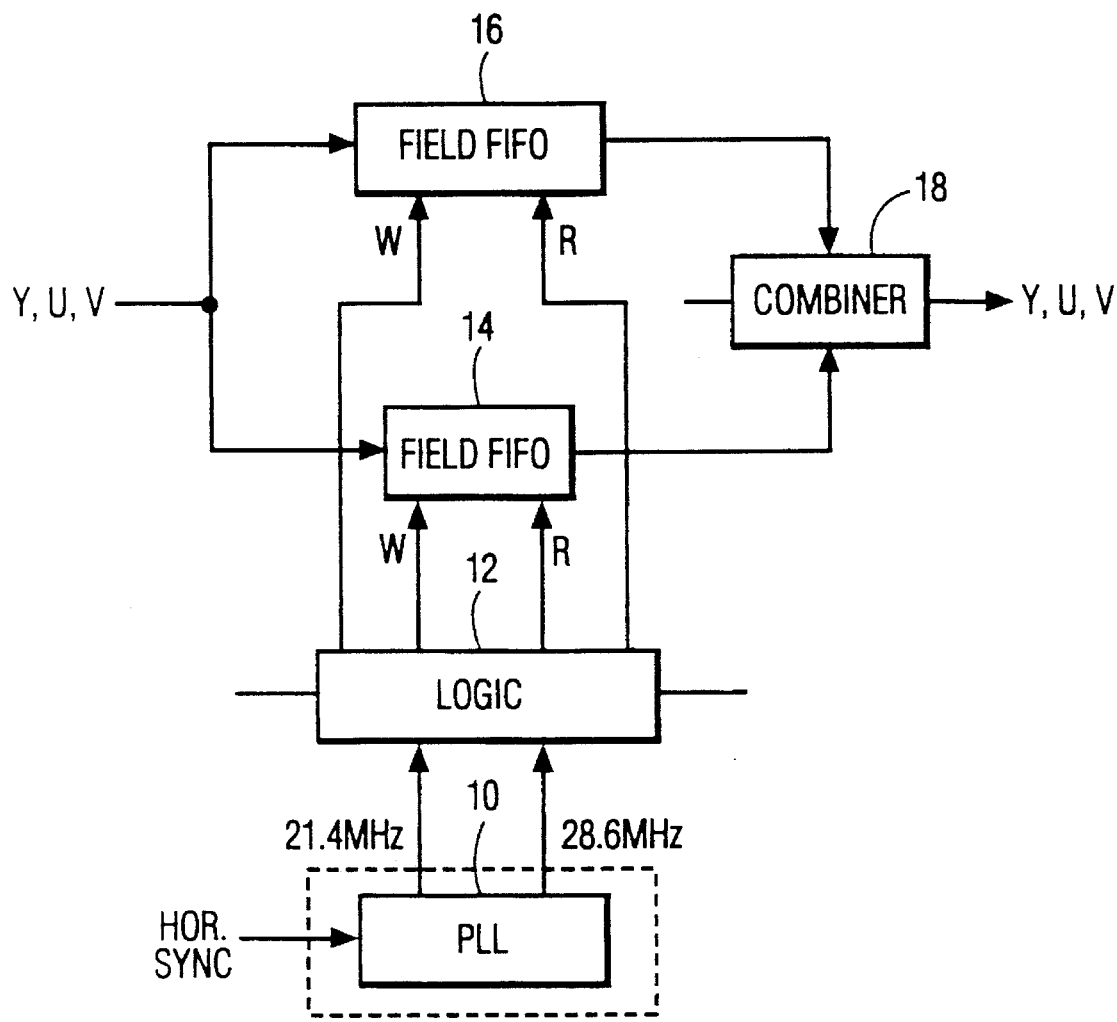
FIG. 2 shows a simplified block diagram of a circuit for writing and reading a video signal to and from a memory.

FIG. 2 shows a block diagram of a circuit arrangement for horizontally compressing a video signal. The horizontal synchronization signal, having the frequency $f_H = 15.734$ KHz., is applied to a phase-locked loop 10 which generates the write clock signal, $f_W = 21.4$ MHz., and the read clock signal, $f_R = 28.6$ MHz. These clock signal are applied to a logic circuit 12 which controls the writing into, in alternating fields, the field FIFO's 14 and 16, and the reading out, in alternating fields, the field FIFO's 16 and 14, respectively, of the y, u, v video signals. The outputs from the FIFO's 14 and 16 are combined in combiner 18 which provides the compressed video signals.

Figure 3:
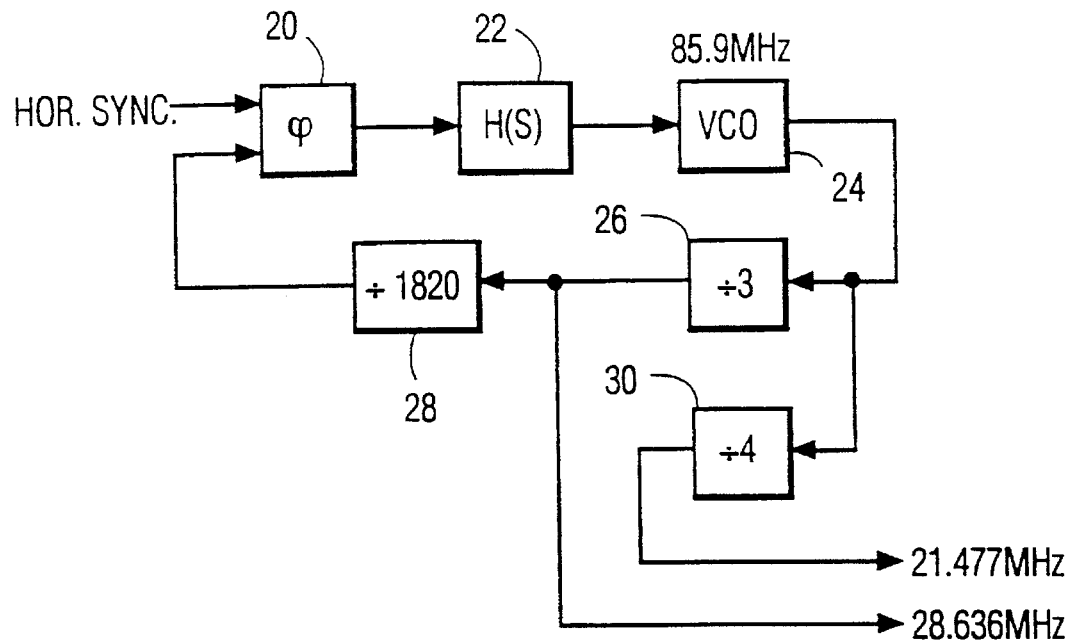
FIG. 3 shows a block diagram of a prior art implementation of the phase-locked loop of FIG. 2.

FIG. 3 shows a prior art implementation of the phase-locked loop of FIG. 2. In particular, the horizontal sync signal is applied to one input of a phase detector 20. The output from the phase detector 20 is applied, through a loop filter 22, and then to the control input of a voltage controlled oscillator (VCO) 24 which is set to oscillate at 85.9 MHz. This output frequency is applied to divider 26 which divides the frequency by the factor 3. An output of this divider 26, carrying a signal with the frequency 28.636 MHz., is, on the one hand, outputted from the phase-locked loop as the read clock signal, and, on the other hand, is applied to a second divider 28 which divides the frequency of this signal by 1820, thereby outputting a signal with the frequency 15.734 KHz., which is the frequency of the horizontal sync. signal. The output from the divider 28 is then applied to the second input of the phase detector 20. Additionally, the output from the VCO 24 is applied to a third divider 30 which divides the frequency of the output signal by the factor 4. The output of this divider 30, carrying a signal with the frequency 21.477 MHz., is outputted from the phase-locked loop as the write clock signal.

It should be apparent that the prior art implementation requires an oscillator having a frequency of 85.9 MHz. and three frequency divider circuits.

Figure 4:
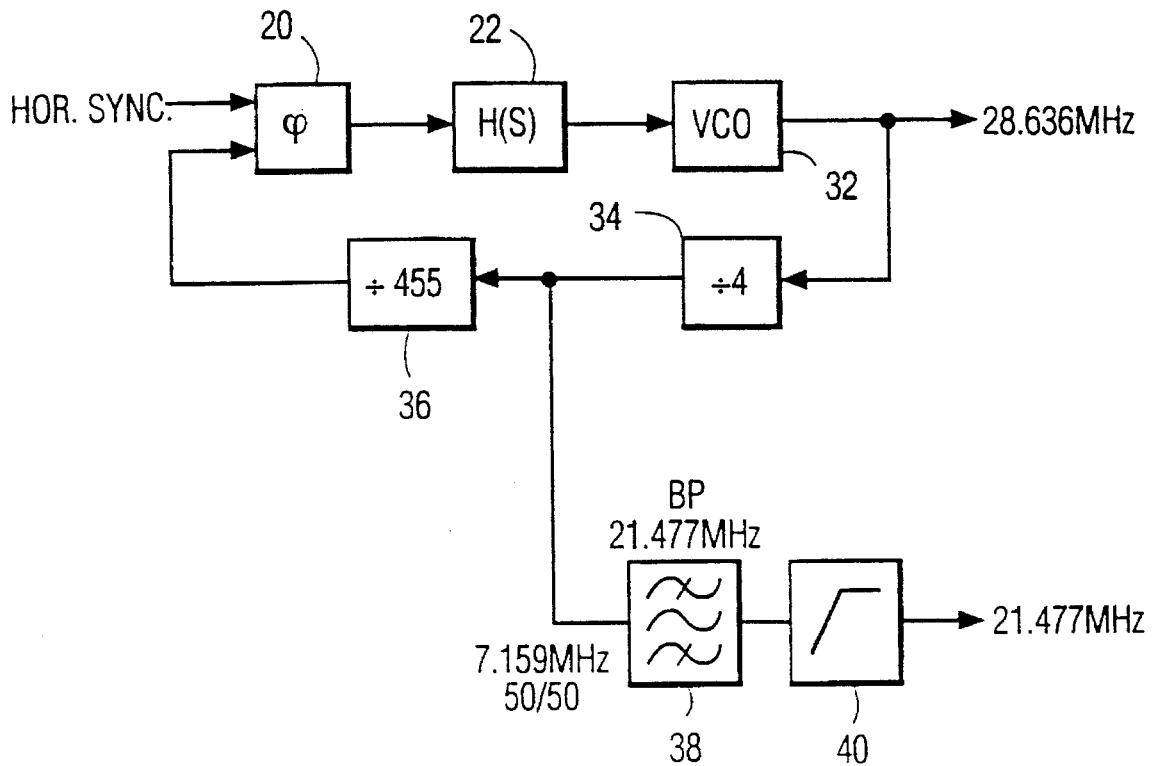
FIG. 4 shows a block diagram of the phase-locked loop of the subject invention.

FIG. 4 shows a block diagram of the phase-locked loop of the subject invention. In particular, the horizontal sync. signal is applied to the first input of the phase detector 20, an output of which is applied to the loop filter 22. The output from the loop filter 22 is applied to VCO 32 which is set to oscillate at 28.636 MHz. The output signal from this VCO 32 is, on the one hand, outputted from the phase-locked loop as the read clock signal, and, on the other hand, is applied to divider 34 which divides the frequency of the applied signal by a factor of 4. The output signal from the divider 34, having the frequency 7.159 MHz., is applied to a second divider 36 which divides the frequency of the applied signal by a factor of 455, resulting in an output signal of 15.734 KHz., which is applied to the second input of the phase detector 20.

The output from the divider 34 is then applied to a band-pass filter 38 which has a narrow passband centered around the write clock signal frequency of 21.477 MHz. This band-pass filter 38 thus allows the third harmonic of the applied signal to pass through to a pulse shaper circuit 40 which thereby forms the write clock signal.

The VCO 32 now need only oscillate at 28.636 MHz. as opposed to VCO 24 of FIG. 3 which oscillated at 85.9 MHz. Thus, less stringent requirements are placed on the VCO. In addition, the phase-locked loop of the subject invention only requires 2 dividing circuits while that of the prior art required 3 dividing circuits. This results in a cost savings over the prior art.

Figure 5A:
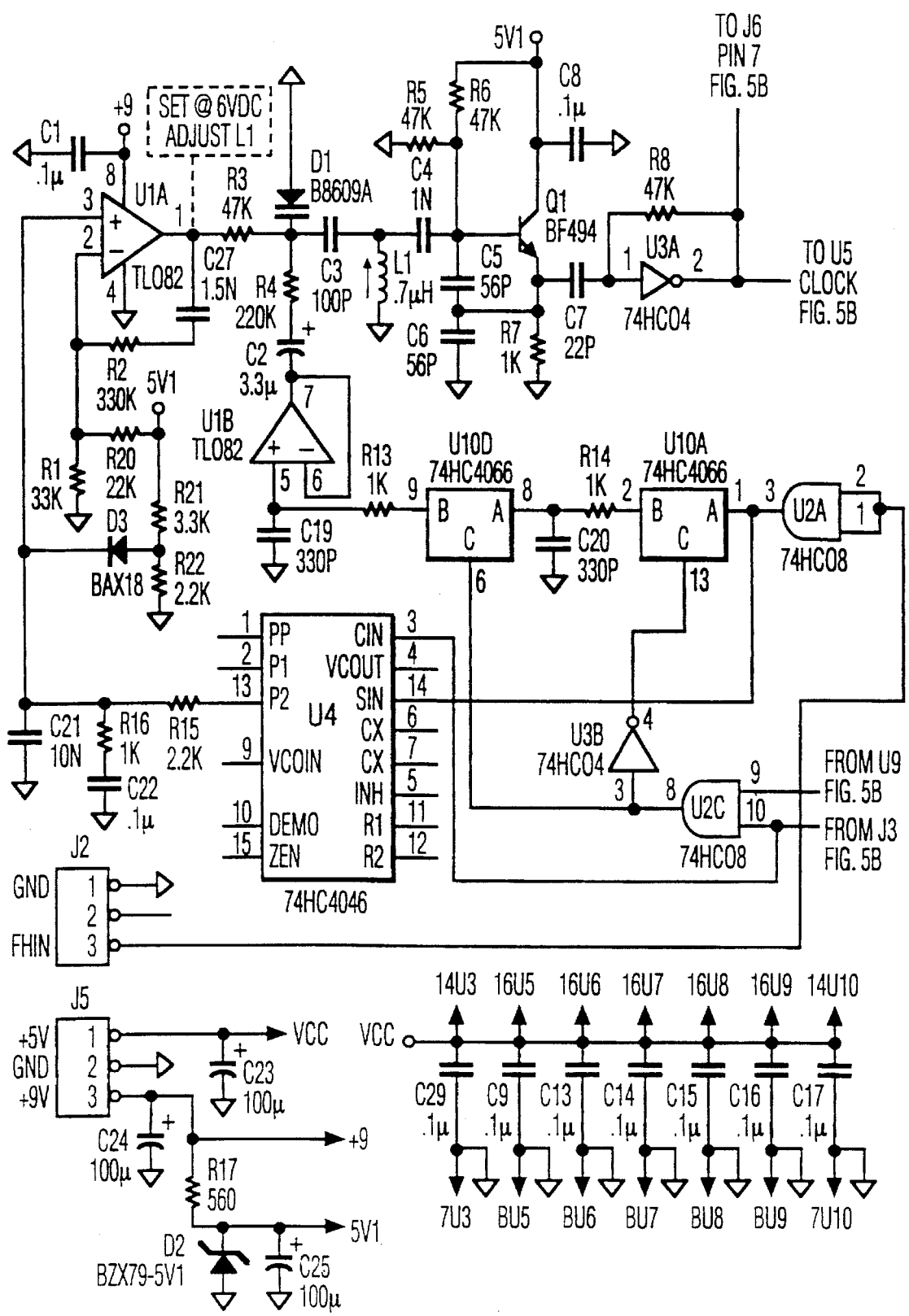
FIGS. 5A and 5B show a schematic diagram of a practical embodiment of the subject invention.
Figure 5B:
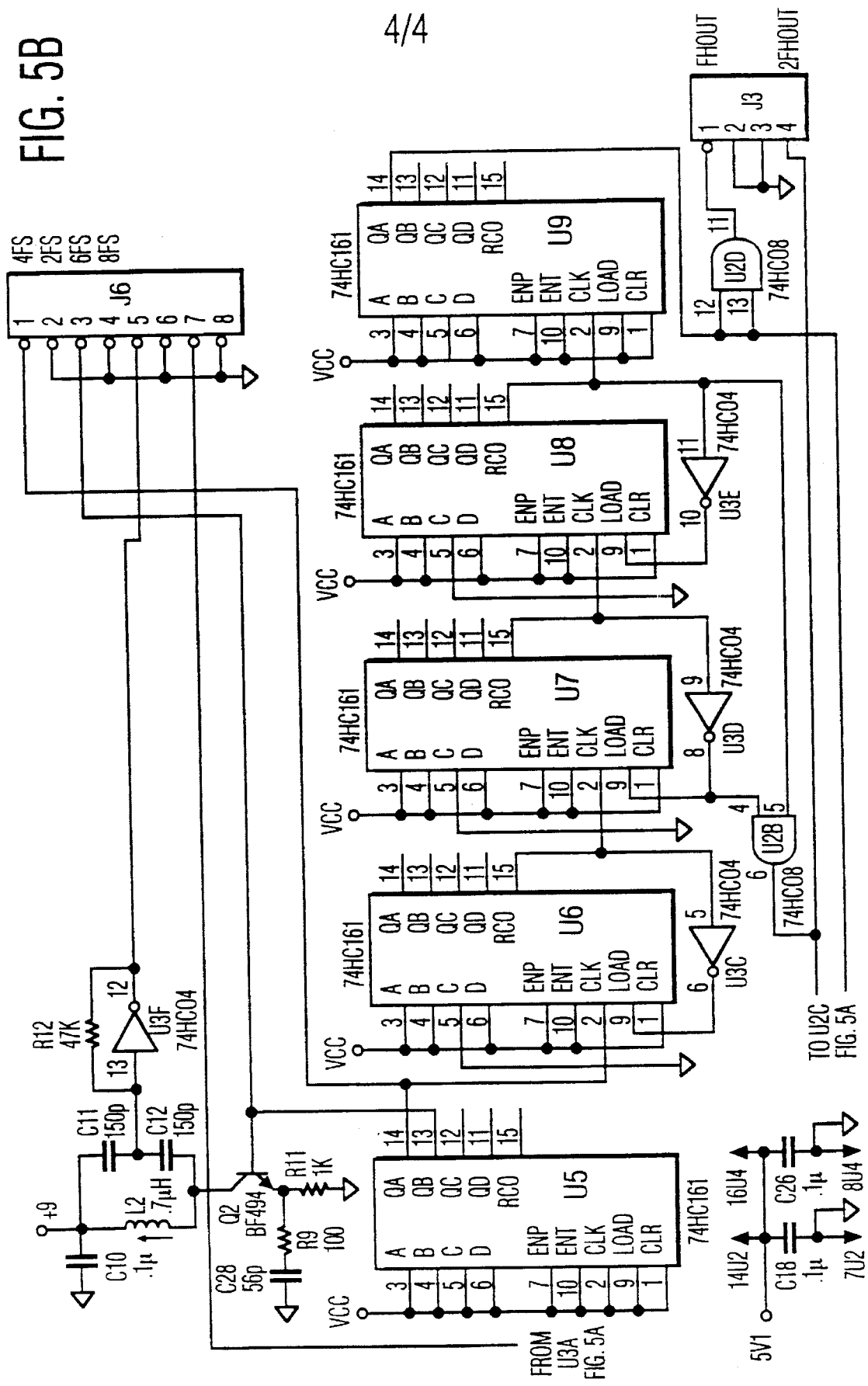

A practical embodiment of the subject invention is shown in FIGS. 5A and 5B. The circuit components shown in FIGS. 5A and 5B are as follows:

| | |
|---|---|
| C1, C8, C9, C10, C13, C14, C15 C16, C17, C18, C22, C26, C29 | 0.1 µf |
| C2 | 3.3 µf |
| C3 | 100 pf |
| C4 | 1 nf |
| C5, C6, C28 | 56 pf |
| C7 | 22 pf |
| C11, C12 | 150 pf |
| C19, C20 | 330 pf |
| C21 | 10 nf |
| C23, C24, C25 | 100 µf |
| C27 | 560 pf |
| L1, L2 | 0.7 µH |
| R1 | 33 kΩ |
| R2 | 330 kΩ |
| R3, R5, R6, R8, R12 | 47 kΩ |
| R4 | 220 kΩ |
| R7, R11, R13, R14, R16 | 1 kΩ |
| R9 | 100 Ω |
| R15, R22 | 2.2 kΩ |
| R17 | 560 Ω |
| R20 | 22 kΩ |
| R21 | 3.3 kΩ |
| D1 | BB609A |
| D2 | BZX79-5V1 |

-continued

| | | |
|---|---|---|
| D3 | | BAX18 |
| Q1, Q2 | | BF494 |
| U1 | | TL082 |
| U2 | guad 2-in AND gate | 74HC08 |
| U3 | hex inverter | 74HC04 |
| U4 | PLL w/VCO | 74HC4046 |
| U5, U6, U7, U8, U9 | 4-bit counter | 74HC161 |
| U10 | quad bilat. sw. | 74HC4066 |

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A circuit in a widescreen television receiver for effecting horizontal picture compression on a standard aspect ratio video signal comprising:

means for storing at least one field of said video signal;

means for generating a read clock signal for reading said video signal from said storing means, said read clock signal having a frequency equal to $F_R$;

means for generating a write clock signal for writing said video signal into said storing means, said write clock signal having a frequency equal to $F_W = \frac{3}{4} F_R$;

write means for writing each line in said video signal in to said storing means using said write clock signal; and read means for reading each line of said stored video signal from said storing means using said read clock signal, whereby said read-out video signal forms, on display, a picture occupying ¾ of the horizontal width of a display of said widescreen television receiver, characterized in that said means for generating a write clock signal comprises:

means for dividing said read clock signal by a factor of 4; and means, coupled to the output of said dividing means, for multiplying said divided read clock signal by a factor of 3, wherein said means for multiplying said divided read clock signal comprises a band-pass filter tuned to $F_W$, whereby said band-pass filter chooses a third harmonic of said divided read clock signal.

2. A circuit as claimed in claim 1, characterized in that said means for multiplying further comprises a pulse shaper coupled to an output of said band-pass filter for clipping and shaping the third harmonic signal thereby forming said write clock signal.

\* \* \* \* \*